(12) United States Patent
Chiu et al.

(10) Patent No.: US 8,174,124 B2
(45) Date of Patent: May 8, 2012

(54) DUMMY PATTERN IN WAFER BACKSIDE ROUTING

(75) Inventors: Ming-Yen Chiu, Hsin-Chu (TW); Hsien-Wei Chen, Sinying (TW); Ming-Fa Chen, Taichung (TW); Shin-Puu Jeng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 141 days.

(21) Appl. No.: 12/756,727

(22) Filed: Apr. 8, 2010

(65) Prior Publication Data
US 2011/0248404 A1  Oct. 13, 2011

(51) Int. Cl.
*H01L 23/48* (2006.01)

(52) U.S. Cl. ......... 257/773; 257/E23.011; 257/E23.174; 257/E21.585; 257/774; 257/686; 257/706; 257/713; 257/621; 257/690; 257/E23.101; 257/E23.145; 257/E29.166

(58) Field of Classification Search .................. 257/773, 257/E23/011, E23.174, E21/585, 774, 686, 257/706, 713, 621, 690, E23.101, E23.145, 257/E29.166
See application file for complete search history.

(56) References Cited

U.S. PATENT DOCUMENTS

| | | |
|---|---|---|
| 3,461,357 A | 8/1969 | Mutter et al. |
| 5,391,917 A | 2/1995 | Gilmour et al. |
| 5,510,298 A | 4/1996 | Redwine |
| 5,767,001 A | 6/1998 | Bertagnolli et al. |
| 5,897,362 A | 4/1999 | Wallace |
| 5,998,292 A | 12/1999 | Black et al. |
| 6,184,060 B1 | 2/2001 | Siniaguine |
| 6,322,903 B1 | 11/2001 | Siniaguine et al. |
| 6,376,332 B1 | 4/2002 | Yanagita et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,897,125 B2 | 5/2005 | Morrow et al. |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |

(Continued)

OTHER PUBLICATIONS

Shen, L-C, et al., "A Clamped Through Silicon Via (TSV) Interconnection for Stacked Chip Bonding Using Metal Cap on Pad and Metal Column Forming in Via," 2008, IEEE, pp. 544-549.

*Primary Examiner* — A O Williams
(74) *Attorney, Agent, or Firm* — Slater & Matsil, L.L.P.

(57) ABSTRACT

A device includes a semiconductor substrate including a front side and a backside. A through-substrate via (TSV) penetrates the semiconductor substrate. A dummy metal line is formed on the backside of the semiconductor substrate, and may be connected to the dummy TSV.

20 Claims, 6 Drawing Sheets

U.S. PATENT DOCUMENTS

| | | |
|---|---|---|
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,291,542 B2 | 11/2007 | Iwamatsu et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,371,663 B2 | 5/2008 | Chen et al. |
| 7,786,584 B2 * | 8/2010 | Barth et al. .................. 257/758 |
| 7,838,337 B2 * | 11/2010 | Marimuthu et al. .......... 438/110 |
| 2004/0151917 A1 | 8/2004 | Chen et al. |
| 2005/0236693 A1 | 10/2005 | Kroninger et al. |
| 2006/0046431 A1 | 3/2006 | Blietz et al. |
| 2006/0099791 A1 | 5/2006 | Mitani et al. |
| 2007/0210259 A1 | 9/2007 | Kerwin et al. |
| 2008/0035854 A1 | 2/2008 | Jin et al. |
| 2008/0057678 A1 | 3/2008 | Gadkaree et al. |
| 2008/0079121 A1 | 4/2008 | Han |
| 2008/0131679 A1 | 6/2008 | Nakai et al. |
| 2009/0140381 A1 | 6/2009 | Lin et al. |
| 2010/0013102 A1 | 1/2010 | Tay et al. |
| 2010/0022034 A1 | 1/2010 | Antol et al. |
| 2010/0090318 A1 | 4/2010 | Hsu et al. |
| 2010/0090319 A1 | 4/2010 | Hsu et al. |
| 2010/0276787 A1 | 11/2010 | Yu et al. |
| 2010/0330798 A1 | 12/2010 | Huang et al. |
| 2011/0049706 A1 | 3/2011 | Huang et al. |
| 2011/0165776 A1 | 7/2011 | Hsu et al. |
| 2011/0186990 A1 * | 8/2011 | Mawatari et al. ............. 257/737 |
| 2011/0193235 A1 * | 8/2011 | Hu et al. ....................... 257/773 |
| 2011/0233785 A1 * | 9/2011 | Koester et al. ................ 257/773 |

* cited by examiner

DUMMY PATTERN IN WAFER BACKSIDE ROUTING

TECHNICAL FIELD

This disclosure relates generally to semiconductor devices, and more particularly to three-dimensional integrated circuits (3DICs), and even more particularly to dummy patterns formed on the backside of wafers.

BACKGROUND

The semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formations, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuits (3DICs) and stacked dies are commonly used. Through-silicon vias (TSVs) are thus used in 3DICs and stacked dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

SUMMARY

In accordance with one aspect, a device includes a semiconductor substrate including a front side and a backside. A through-substrate via (TSV) penetrates the semiconductor substrate. A dummy metal line is formed on the backside of the semiconductor substrate, and may be connected to the TSV.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel integrated circuit device comprising through-substrate vias (TSVs) and the method of forming the same are provided in accordance with an embodiment. The variations of the embodiment are then discussed. Throughout the various views and illustrative embodiments, like reference numbers are used to designate like elements.

Figure 1:
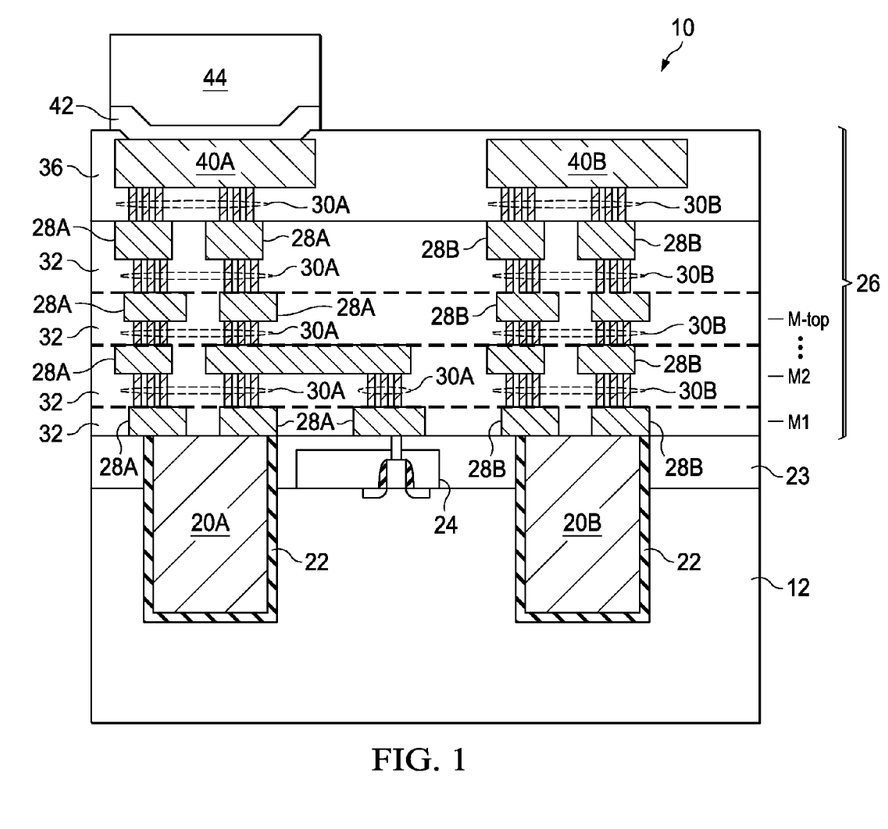
FIGS. 1 through 3 are, in accordance with various embodiments, cross-sectional views of intermediate stages in the manufacturing of a wafer comprising dummy through-substrate vias (TSVs) and dummy metal features on a backside of the wafer.
Figure 2:
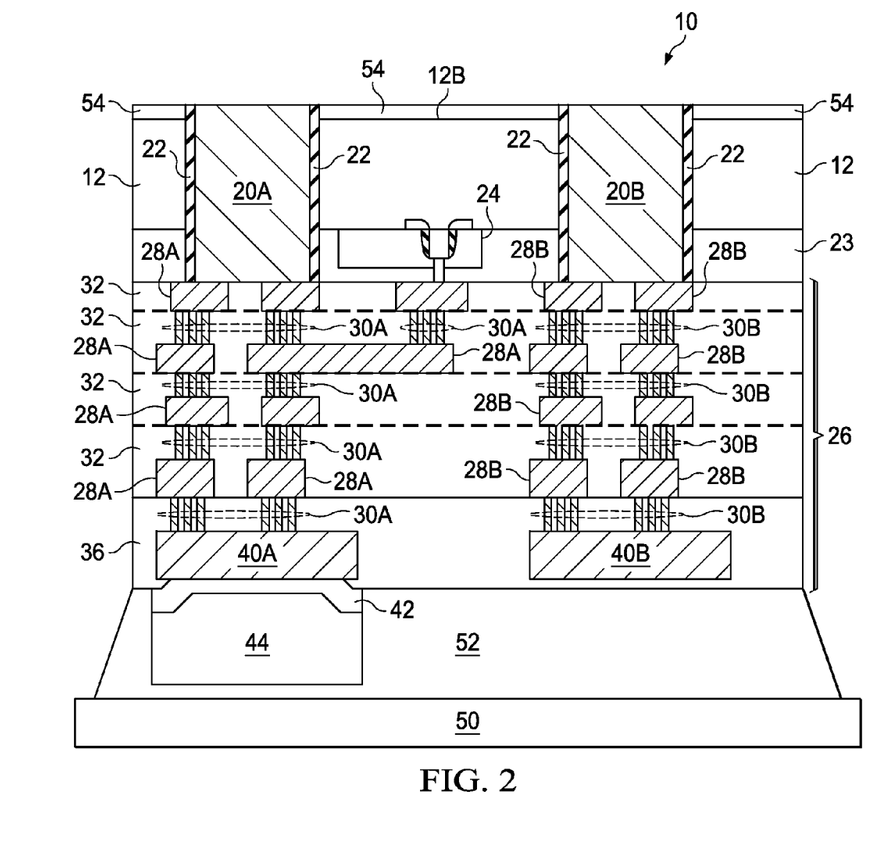
Figure 3:
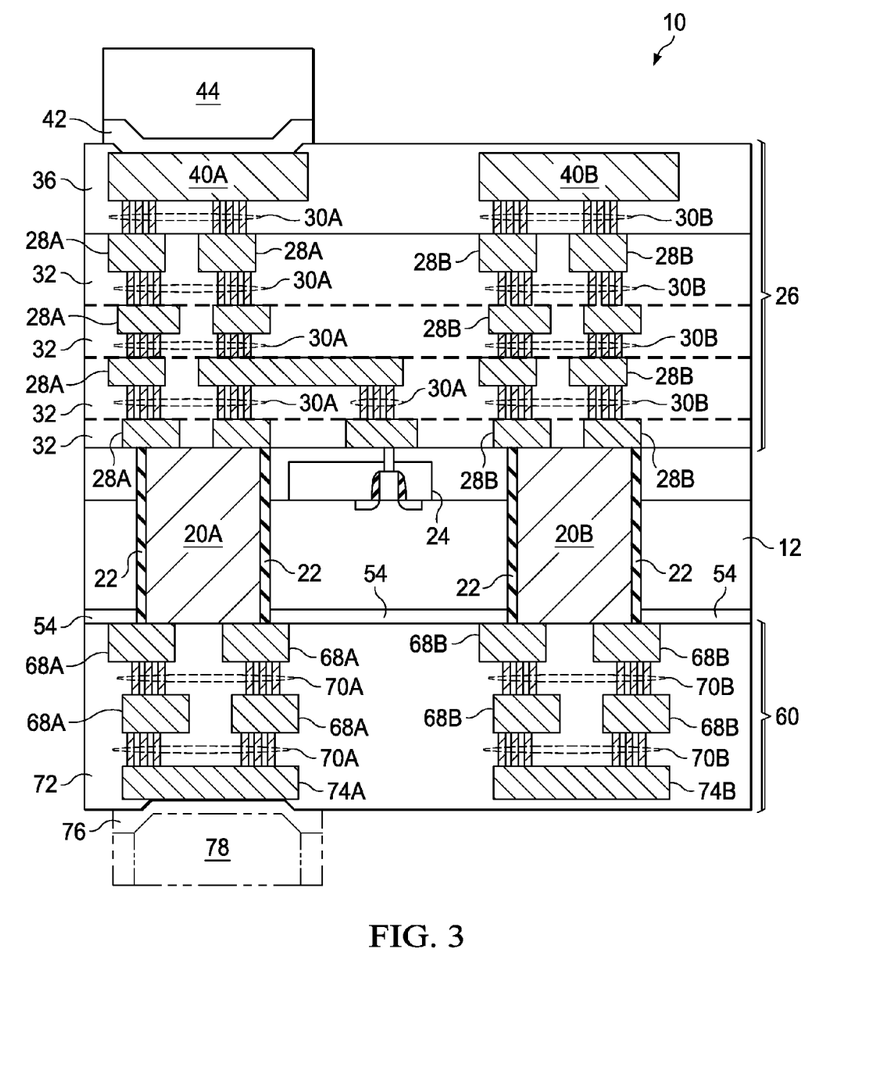

FIGS. 1 through 3 illustrate cross-sectional views of intermediate stages in the manufacturing of a wafer comprising dummy metal features on a backside of the wafer and dummy TSVs in the wafer. FIG. 1 illustrates a portion of semiconductor chip 10, which may also be a portion of an un-sawed wafer (also referred to as wafer 10). Wafer 10 includes substrate 12, on which active circuits 24 are formed. Substrate 12 may be a semiconductor substrate formed of commonly used semiconductor materials, such as silicon, silicon germanium, silicon carbide, gallium arsenide, or the like. Active circuits 24 may include complementary metal-oxide-semiconductor (CMOS) transistors, diodes, resistors, capacitors (not shown), and/or the like. Interconnect structure 26 is formed over active circuits 24. Interconnect structure 26 includes a plurality of metallization layers comprising metal lines 28 (including active metal lines 28A and dummy metal lines 28B) and vias 30 (including active vias 30A and dummy vias 30B) in a plurality of dielectric layers 32, which include commonly known inter-metal dielectrics (IMDs). Metal lines 28 are also commonly known as trench interconnects. Dielectric layers 32 in interconnect structure 26 may include low-k dielectric layers, which may have k values lower than about 3.0, or even lower than about 2.5.

Dummy metal lines 28B and dummy vias 30B may be formed in the metallization layers including the bottom metallization layer (commonly known as M1), the top metallization layer (commonly known as M-top), and all metallization layers therebetween. Dummy metal lines 28B and dummy vias 30B in different metallization layers may vertically overlap each other, and connect with each other to form a tower, or may be isolated from each other. Metal lines 28 and vias 30 may be formed using damascene processes. Alternatively, they may be formed by depositing blanket metal layers, and then etching the blanket metal layers to form desirable patterns. Active metal lines 28A and active vias 30A have electrical functions for electrically coupling integrated circuit devices. For example, active metal lines 28A and active vias 30A may interconnect different devices in active circuits 24, and may connect active circuits 24 to overlying metal pads and solder bumps.

Metal pads 40 (including active metal pad 40A and dummy metal pad 40B) are formed over interconnect structure 26, and may be formed in passivation layer(s) 36, which may be formed of silicon oxide, silicon nitride, un-doped silicate glass (USG), polyimide, or the like. Metal pads 40 may comprise aluminum, and hence are also referred to as aluminum pads 40 throughout the description, although they may also be formed of, or include, other metallic materials, such as copper, silver, gold, nickel, tungsten, alloys thereof, and/or multilayers thereof. Active metal pad 40A may be electrically coupled to active circuits 24 through active metal lines 28A and active vias 30A in interconnect structure 26. In an embodiment, metal pads 40 are formed of aluminum copper (AlCu). Over metal pads 40, under-bump-metallurgies (UBMs) 42 and metal bump 44 may be formed. In an embodiment, metal bump 44 is a solder bump. In alternative embodiments, metal bump 44 is a copper bump, and may be coated with nickel, gold, or other metals or metal alloys.

Dummy metal pad 40B may be formed at a same level, and formed simultaneously with, active metal pad 40A. Dummy metal pad 40B, dummy metal lines 28B, and dummy vias 30B may not have any electrical function. In other words, they may be electrically decoupled from all active circuits in wafer 10, and may be electrically decoupled from metal bumps/metal pads on the surface of wafer 10. In an embodiment, dummy metal pad 40B, dummy metal lines 28B, and dummy vias 30B are electrically floating. With the formation of dummy metal pad 40B, dummy metal lines 28B, and dummy vias 30B, the pattern densities in wafer 10 become more uniform, and hence the pattern-loading effect in the formation of metal lines 28, vias 30, and metal pads 40 is reduced.

Through-substrate vias (TSVs) 20 (including active TSV 20A and dummy TSV 20B) are formed in wafer 10 and extend into substrate 12. In a first embodiment, as shown in FIG. 1, TSVs 20 are formed using a via-first approach, and is formed before the formation of a bottom metallization layer (commonly known as Ml). Accordingly, TSVs 20 only extend into inter-layer dielectric (ILD) 23 that is used to cover the active devices, but not into the IMD layers in interconnect structure 26. In alternative embodiments, TSVs 20 are formed using a via-last approach, and are formed after the formation of interconnect structure 26. Accordingly, TSVs 20 penetrate through both substrate 12 and interconnect structure 26, and extend into substrate 12. Isolation layers 22 are formed on the sidewalls of TSVs 20 and electrically insulate TSVs 20 from substrate 12. Isolation layers 22 may be formed of commonly used dielectric materials, such as silicon nitride, silicon oxide (for example, tetra-ethyl-ortho-silicate (TEOS) oxide), or the like.

Active TSV 20A may be electrically coupled to active circuits 24, active metal lines 28A and active vias 28B. Dummy TSV 20B may be electrically coupled to, or may be decoupled from, dummy metal lines 28B and dummy vias 28B. Further, dummy TSV 20B may physically contact the dummy features in interconnect structure 26 to form an integrated metal structure. Similarly, with the formation of dummy TSV 20B, the pattern density of TSV openings (filled with TSVs 20) may be more uniform than if no dummy TSV 20B is formed, and the pattern-loading effect, for example, in the etching of substrate 12 for the formation of TSVs 20, is reduced.

Referring to FIG. 2, carrier 50 is bonded to the front side of wafer 10 through adhesive 52. A backside grinding is performed to remove excess portions of substrate 12 so that TSVs 20 are exposed. Backside isolation layer 54 is formed to cover back surface 12B of substrate 12. In an exemplary embodiment, the formation of backside isolation layer 54 includes slightly etching back surface 12B of substrate 12, blanket forming backside isolation layer 54, and performing a light chemical mechanical polish (CMP) to remove the portion of backside isolation layer 54 directly over TSVs 20. Accordingly, TSVs 20 are exposed through backside isolation layer 54.

Next, as shown in FIG. 3, backside interconnect structure 60 is formed on the backside of wafer 10, and then carrier 50 is de-bonded. Backside interconnect structure 60 may also include a plurality of metal lines 68 (including active metal lines 68A and dummy metal lines 68B) and vias 70 (including active vias 70A and dummy vias 70B) in a plurality of dielectric layers 72. Dielectric layer 72 may be formed of dielectric materials, such as silicon oxide, silicon nitride, polyimide, and/or the like, and may be formed using CVD, spin-on, or other commonly used methods. Again, active metal lines 68A and active vias 70A have electrical functions for interconnecting integrated circuit devices, and may be electrically coupled to active TSV 20A, active circuits 24, active metal lines 28A, and/or active vias 30A. Dummy metal lines 68B and dummy vias 70B may not have electrical functions, and may be electrically floating. However, dummy metal lines 68B and dummy vias 70B may be electrically coupled to dummy TSV 20A, dummy metal lines 28A, and/or dummy vias 30A, although all of them may be electrically floating. Throughout the description, when a first dummy feature is referred to as being "electrically coupled" to a second dummy feature, it indicates that a conductive path may be found between the first and the second dummy features, although both of them may be floating. Again, metal lines 68 and vias 70 may be formed either using damascene processes, or formed by depositing and etching blanket metal layers. In an embodiment, the backside interconnect structure includes active metal pad (or bond pad) 74A and dummy metal pad 74B, wherein active metal pad 74A is used for bonding the respective chip to another device, such as a die or a package substrate. Dummy metal pad 74B, on the other hand, is not used for bonding, and may be electrically floating. In alternative embodiments, UBM 76 and metal bump 78 may be formed on active metal pad 74A.

In subsequent steps, wafer 10 is sawed into dies, during the use of the dies, electrical signals may be connected to active circuits 24, active metal lines 28A/68A, and active vias 30A/70A. However, no electrical signal or voltage may be connected to dummy metal lines 28A/68A and dummy vias 30A/70A.

Figure 4:
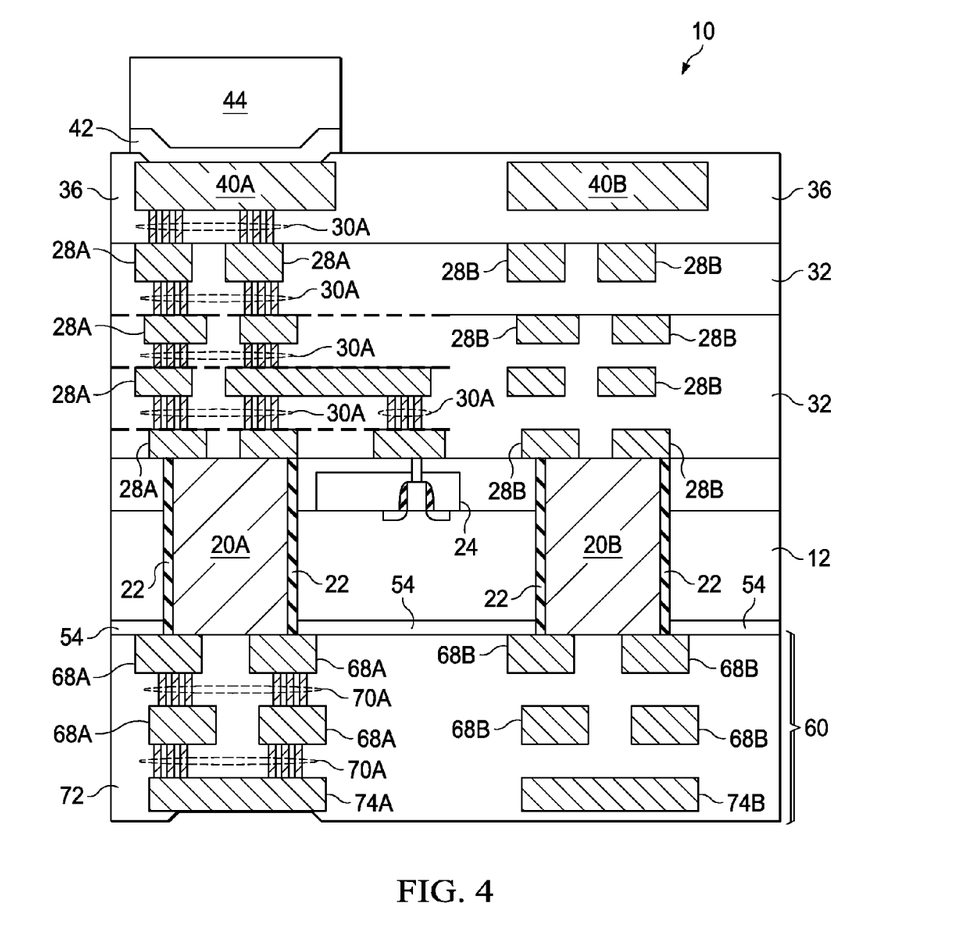
FIGS. 4 through 6 are cross-sectional views of wafers in accordance with alternative embodiments, wherein the wafers comprise dummy TSVs and dummy metal features in backside interconnect structures.
Figure 5:
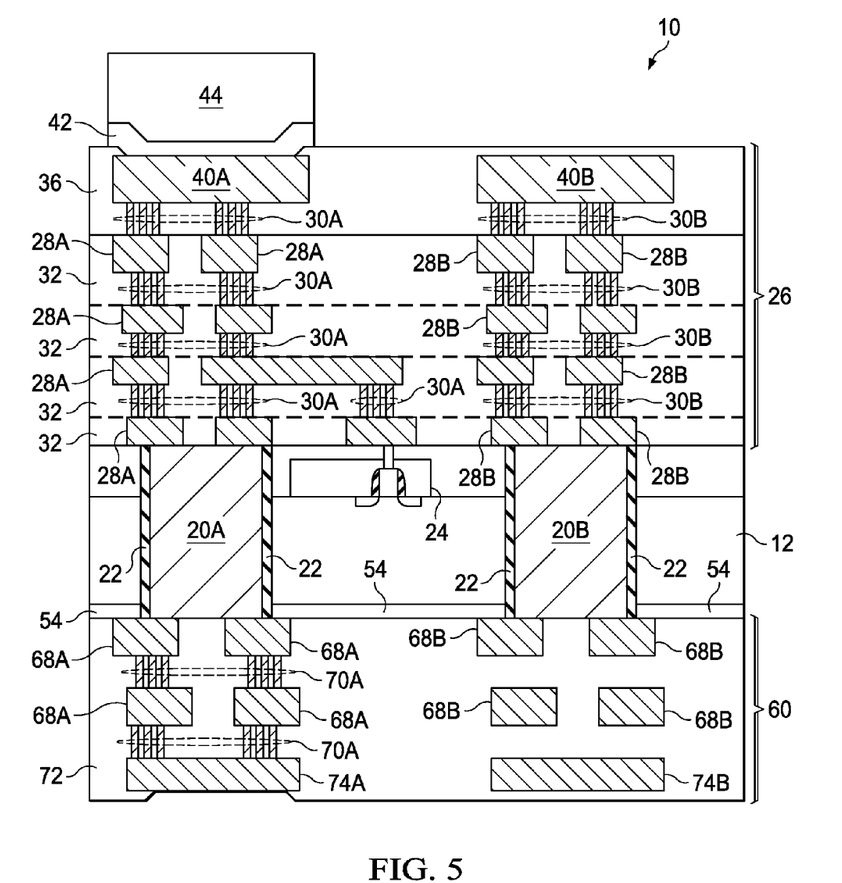
Figure 6:
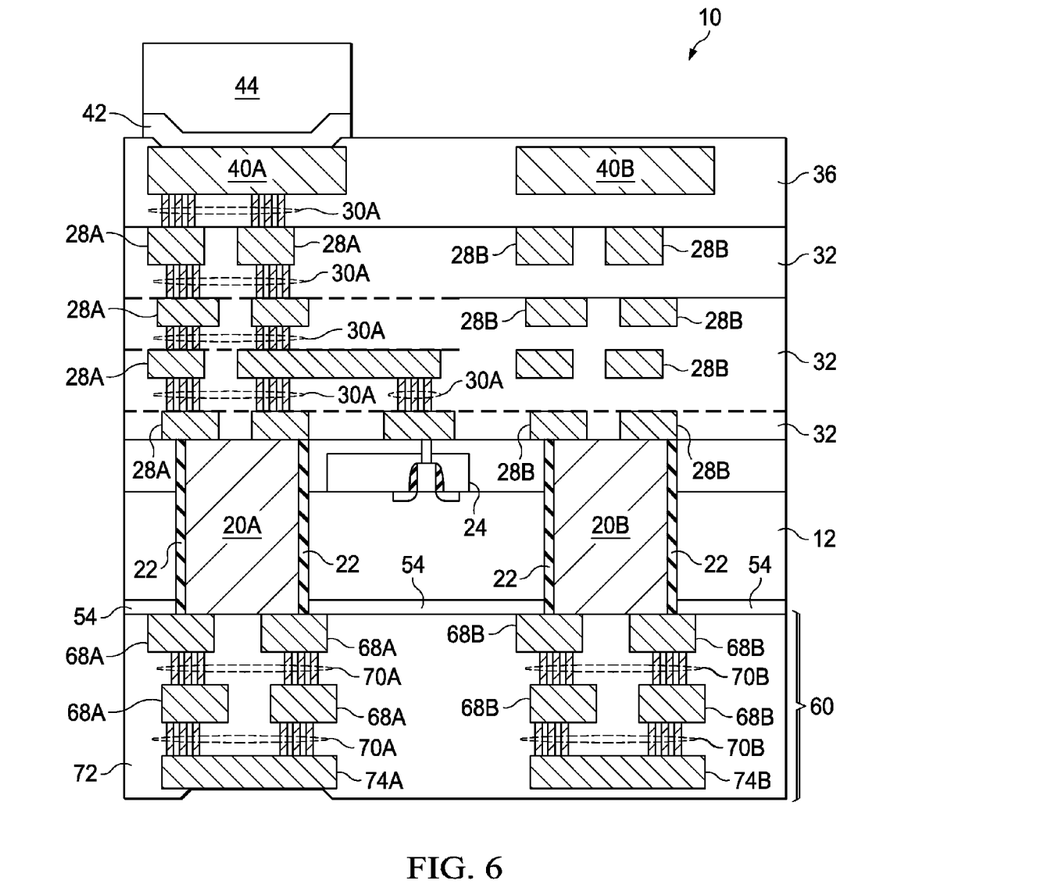

FIGS. 4 through 6 illustrate variations of the embodiments. Like reference notations in these embodiments represent like elements as in the previously discussed embodiments, unless specified otherwise. The embodiment shown in FIG. 4 is similar to the embodiment shown in FIG. 3, except no dummy vias are formed in any of front-side interconnect structure 26 and backside interconnect structure 60. However, dummy metal lines 28B and 68B are still formed. In FIG. 5, dummy vias 30B are formed in front-side interconnect structure 26, while no dummy vias are formed in backside interconnect structure 60. Accordingly, dummy metal lines 68B are formed as discrete features electrically insulated from each other. FIG. 6 illustrates the embodiments with no dummy vias formed in front-side interconnect structure 26, while dummy vias 70B are formed in backside interconnect structure 60. In addition, in each of the embodiments shown in FIGS. 3 through 6, dummy TSV 20B may, or may not, be formed, while active TSV 20A is still formed.

With the formation of dummy metal lines and dummy vias on the backside of wafer 10, the formation of backside interconnect structure 60 suffers less from pattern-loading effects. Further, the dummy metal lines and dummy vias on the backside of wafer 10 may be connected to the dummy metal lines and dummy vias on the front side of wafer 10 to form an integrated metal feature. As a result, the likelihood of dielectric peeling between dielectric layers 32 and 72 is reduced, and hence the strength of wafer 10 may be improved.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate comprising a front side and a backside;
    a through-substrate via (TSV) penetrating the semiconductor substrate; and
    a first dummy metal line on the backside of the semiconductor substrate.

2. The device of claim 1 further comprising an active circuit on the front side of the semiconductor substrate, wherein the active circuit comprises a transistor.

3. The device of claim 2 further comprising a dummy TSV penetrating the semiconductor substrate.

4. The device of claim 3, wherein the first dummy metal line is electrically coupled to the dummy TSV, and wherein the first dummy metal line and the dummy TSV are electrically floating.

5. The device of claim 4 further comprising a second dummy metal line on the front side of the semiconductor substrate, wherein the second dummy metal line is electrically coupled to the dummy TSV and the first dummy metal line.

6. The device of claim 4 further comprising:
    a plurality of dielectric layers on the backside of the semiconductor substrate;
    a plurality of dummy metal lines, with one of the plurality of dummy metal lines in each of the plurality of dielectric layers; and
    a plurality of dummy vias electrically coupled to the plurality of dummy metal lines, with the plurality of dummy metal lines, the plurality of dummy vias, and the dummy TSV forming an integrated metal structure.

7. The device of claim 1 further comprising a bond pad on the backside of the semiconductor substrate, and a dummy metal pad at a same level as the bond pad.

8. The device of claim 1 further comprising a dummy via on the backside of the semiconductor substrate and connected to the first dummy metal line.

9. A device comprising:
    a semiconductor substrate comprising a front side and a backside;
    an active circuit on the front side of the semiconductor substrate;
    a through-substrate via (TSV) penetrating the semiconductor substrate;
    a dummy TSV penetrating the semiconductor substrate; and
    a first dummy metal line on the backside of the semiconductor substrate and electrically coupled to the dummy TSV, wherein the first dummy metal line and the dummy TSV are electrically floating.

10. The device of claim 9, wherein the first dummy metal line physically contacts the dummy TSV.

11. The device of claim 9, wherein the semiconductor substrate is a portion of a chip, and wherein the device further comprises:
    a bond pad at a back surface of the chip; and
    a dummy metal feature at a same level as the bond pad.

12. The device of claim 9 further comprising:
    a plurality of dielectric layers on the backside of the semiconductor substrate; and
    a plurality of dummy metal features, with each of the plurality of dielectric layers comprising one of the plurality of dummy metal features therein, and wherein the plurality of dummy metal features and the dummy TSV form an integrated metal structure.

13. The device of claim 12 further comprising a plurality of dummy vias, each in one of the plurality of dielectric layers and contacting a respective one of the plurality of dummy metal features.

14. The device of claim 9 further comprising a second dummy metal line on the front side of the semiconductor substrate.

15. The device of claim 14, wherein the second dummy metal line is electrically coupled to the dummy TSV and the first dummy metal line.

16. The device of claim 14 further comprising:
    a plurality of dielectric layers on the front side of the semiconductor substrate; and
    a plurality of dummy metal features, with each of the plurality of dielectric layers comprising one of the plurality of dummy metal features therein, wherein the plurality of dummy metal features is electrically coupled to the dummy TSV.

17. A device comprising:
    a semiconductor substrate comprising a front side and a backside;
    an active circuit on the front side of the semiconductor substrate;
    a through-substrate via (TSV) penetrating the semiconductor substrate;
    a dummy TSV penetrating the semiconductor substrate;
    a first plurality of dielectric layers on the backside of the semiconductor substrate;
    a first plurality of dummy metal features, with each of the first plurality of dielectric layers comprising one of the first plurality of dummy metal features therein;
    a second plurality of dielectric layers on the front side of the semiconductor substrate; and
    a second plurality of dummy metal features, with each of the second plurality of dielectric layers comprising one of the second plurality of dummy metal features therein, and wherein the first and the second plurality of dummy metal features and the dummy TSV form an integrated metal structure, and are electrically floating.

18. The device of claim 17 further comprising a bond pad on the backside of the semiconductor substrate, wherein one of the first plurality of dummy metal features is at a same level as the bond pad.

19. The device of claim 17, wherein one of the first plurality of dummy metal features is a dummy via.

20. The device of claim 2, wherein the first dummy metal line is electrically floating.

* * * * *